United States Patent
Zhang et al.

(10) Patent No.: US 10,043,446 B1
(45) Date of Patent: Aug. 7, 2018

(54) ORGANIC LIGHT-EMITTING DIODE DISPLAY ASSEMBLY AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Chenggeng Zhang, Beijing (CN); Ying Liu, Beijing (CN)

(73) Assignees: BOE TECHNOLOGY GROUP CO., LTD. (CN); ORDOS YUANSHENG OPTOELECTRONICS CO., LTD. (CN)

( * ) Notice: Subject to any disclaimer, the term of this patent is extended or adjusted under 35 U.S.C. 154(b) by 86 days.

(21) Appl. No.: 15/322,458

(22) PCT Filed: Jul. 11, 2016

(86) PCT No.: PCT/CN2016/089592
§ 371 (c)(1),
(2) Date: Dec. 28, 2016

(87) PCT Pub. No.: WO2017/121083
PCT Pub. Date: Jul. 20, 2017

(30) Foreign Application Priority Data

Jan. 15, 2016 (CN) .......................... 2016 1 0028326

(51) Int. Cl.
*G09G 3/3233* (2016.01)
*G09G 3/3258* (2016.01)
(Continued)

(52) U.S. Cl.
CPC ........... *G09G 3/3233* (2013.01); *G09G 3/006* (2013.01); *G09G 3/3258* (2013.01);
(Continued)

(58) Field of Classification Search
CPC ..... G09G 3/3233; G09G 3/006; G09G 3/3258
See application file for complete search history.

(56) References Cited

U.S. PATENT DOCUMENTS

| 9,501,997 B2 | 11/2016 | Huang et al. |
| 2008/0150504 A1 | 6/2008 | Wong et al. |
| (Continued) | | |

FOREIGN PATENT DOCUMENTS

| CN | 101207327 A | 6/2008 |
| CN | 102237036 A | 11/2011 |
| (Continued) | | |

OTHER PUBLICATIONS

First Office Action for Chinese Application No. 201610028326.4, dated Sep. 5, 2017, 6 Pages.
(Continued)

*Primary Examiner* — Michael Faragalla
*Assistant Examiner* — Sujit Shah
(74) *Attorney, Agent, or Firm* — Brooks Kushman P.C.

(57) ABSTRACT

An OLED display assembly includes a DC-DC power source driver chip and an OLED display panel. The DC-DC power source driver chip is provided with a soft-start circuit including a first time-delay circuit, a first anti-surge circuit and a second anti-surge circuit. The first time-delay circuit is configured to disable the first anti-surge circuit and enable the second anti-surge circuit at an initialization stage, delay a voltage applied to an output end of the first time-delay circuit, and after the end of the initialization stage, enable the first anti-surge circuit and disable the second anti-surge circuit. The first anti-surge circuit is configured to control, after the end of the initialization stage, a voltage applied to the first input end of the OLED display panel. The second
(Continued)

anti-surge circuit is configured to control, at the initialization stage, a voltage applied to the first input end of the OLED display panel.

20 Claims, 3 Drawing Sheets

(51) Int. Cl.
G09G 3/00 (2006.01)
H02M 1/36 (2007.01)
H01L 27/32 (2006.01)
H02H 3/087 (2006.01)
H02M 1/00 (2006.01)
G09G 3/36 (2006.01)

(52) U.S. Cl.
CPC .......... *H01L 27/3276* (2013.01); *H02M 1/36* (2013.01); *G09G 3/3688* (2013.01); *G09G 2330/028* (2013.01); *H02H 3/087* (2013.01); *H02M 2001/0058* (2013.01)

(56) References Cited

U.S. PATENT DOCUMENTS

| | | | | |
|---|---|---|---|---|
| 2011/0273109 A1* | 11/2011 | Park | ............ | G09G 3/3225 315/291 |
| 2011/0273422 A1* | 11/2011 | Park | ............ | G09G 3/3233 345/211 |
| 2011/0273427 A1 | 11/2011 | Park | | |
| 2013/0241808 A1* | 9/2013 | Kwon | ............ | H02M 3/158 345/76 |
| 2014/0022149 A1* | 1/2014 | Kwon | ............ | G09G 3/3233 345/76 |
| 2014/0118414 A1* | 5/2014 | Seo | ............ | G09G 3/3208 345/690 |
| 2015/0035514 A1* | 2/2015 | Koyama | ............ | H01L 27/1222 323/351 |
| 2015/0130690 A1* | 5/2015 | Kim | ............ | G09G 3/3233 345/78 |
| 2015/0325205 A1 | 11/2015 | Zhang | | |

FOREIGN PATENT DOCUMENTS

| | | |
|---|---|---|
| CN | 102243841 A | 11/2011 |
| CN | 103236234 A | 8/2013 |
| CN | 103354083 A | 10/2013 |
| CN | 104269148 A | 1/2015 |
| CN | 105469742 A | 4/2016 |
| JP | 2007189522 A | 7/2007 |
| KR | 1020050034259 A | 4/2005 |
| KR | 1020050069871 A | 7/2005 |

OTHER PUBLICATIONS

International Search Report and Written Opinion for Application No. PCT/CN2016/089592, dated Oct. 17, 2016, 14 Pages.

* cited by examiner

US 10,043,446 B1

ORGANIC LIGHT-EMITTING DIODE DISPLAY ASSEMBLY AND DISPLAY DEVICE

CROSS-REFERENCE TO RELATED APPLICATIONS

This application is the U.S. national phase of PCT Application No. PCT/CN2016/089592 filed on Jul. 11, 2016, which claims priority to Chinese Patent Application No. 201610028326.4 filed on Jan. 15, 2016, the disclosures of which are incorporated in their entirety by reference herein.

TECHNICAL FIELD

The present disclosure relates to the field of display technology, in particular to an organic light-emitting diode display assembly and a display device.

BACKGROUND

For a traditional liquid crystal display device, its brightness is mainly adjusted by adjusting brightness of a backlight unit, and a liquid crystal unit is controlled by a pixel unit. In the case that no signal is applied to a gate line at a pixel region, the liquid crystal display device may not emit light. For an active matrix organic light-emitting diode (AMOLED) display device, an OLED may emit light through voltage programming. In the case that the existing AMOLED display device is started, a large current surge may occur, resulting in display defects. In addition, at an initialization stage, current leakage may occur for an OLED panel, so an impact may be caused to an ELVSS pin inside a direct-current (DC)-DC power source driver chip, and thereby reliability of the DC-DC power source driver chip may be adversely affected.

SUMMARY

An object of the present disclosure is to provide an OLED display assembly and a display device, so as to suppress a current surge in the case that the display device is started, prevent the occurrence of display defects, prevent the occurrence of current leakage at an initialization stage, and improve the reliability of a DC-DC power source driver chip.

In one aspect, the present disclosure provides in some embodiments an OLED display assembly, including a DC-DC power source driver chip and an OLED display panel. The DC-DC power source driver chip is provided with a soft-start circuit, which includes a first time-delay circuit, a first anti-surge circuit and a second anti-surge circuit. A first input end of the first time-delay circuit is connected to a high level signal line, a second input end thereof is connected to a low level signal line, and an output end thereof is connected to the first anti-surge circuit and the second anti-surge circuit. The first time-delay circuit is configured to disable the first anti-surge circuit and enable the second anti-surge circuit at an initialization stage, delay a voltage applied to the output end of the first time-delay circuit, and after the end of the initialization stage, enable the first anti-surge circuit and disable the second anti-surge circuit. The first anti-surge circuit is connected between a first input end of the OLED display panel and the second input end of the first time-delay circuit, and configured to control, after the end of the initialization stage, a voltage applied to the first input end of the OLED display panel. The second anti-surge circuit is connected between the first input end and a second input end of the OLED display panel, and configured to control, at the initialization stage, a voltage applied to the first input end of the OLED display panel. The second input end of the OLED display panel is connected to the first input end of the first time-delay circuit.

According to the OLED display assembly in the embodiments of the present disclosure, the first anti-surge circuit is connected between the first input end of the OLED display panel and the second input end of the first time-delay circuit, and the second anti-surge circuit is connected between the first input end and the second input end of the OLED display panel, so the first time-delay circuit may disable the first anti-surge circuit and enable the second anti-surge circuit at the initialization stage. At the initialization stage, the first input end of the OLED display panel is electrically disconnected from the second input end of the first time-delay circuit through the first anti-surge circuit, so as to prevent an impact of current leakage of the OLED display panel on a pin of the DC-DC power source driver chip for applying a low level signal, thereby to protect the DC-DC power source driver chip and improve the reliability of the DC-DC power source driver chip. In addition, the first time-delay circuit is configured to delay the voltage applied to the output end of the first time-delay circuit, and after the end of the initialization stage, enable the first anti-surge circuit and disable the second anti-surge circuit. As a result, the first anti-surge circuit may operate in a delayed manner, so it is able to prevent the occurrence of the current surge in the case that a display device is started, thereby to prevent the occurrence of the display defects.

In a possible embodiment of the present disclosure, the soft-start circuit further includes a second time-delay circuit, one end of which is connected to the output end of the first time-delay circuit, the other end of which is connected to the first anti-surge circuit, and which is configured to control an operation of the first anti-surge circuit.

In a possible embodiment of the present disclosure, the first time-delay circuit includes a first resistor, a second resistor, a first capacitor and an operational amplifier. One end of the first resistor is connected to the second input end of the first time-delay circuit, and the other end thereof is connected to one end of the second resistor. The other end of the second resistor is connected to the first input end of the first time-delay circuit. The first capacitor is connected in parallel with the first resistor. A non-inverting input end of the operational amplifier is connected between the first resistor and the second resistor, an inverting input end thereof is connected to a reference voltage end, and an output end thereof is connected to the first anti-surge circuit and the second anti-surge circuit.

In a possible embodiment of the present disclosure, the first anti-surge circuit includes a first thin film transistor (TFT), a gate electrode of which is connected to the output end of the operational amplifier, a source electrode of which is connected to the second input end of the first time-delay circuit, and a drain electrode of which is connected to the first input end of the OLED display panel.

In a possible embodiment of the present disclosure, the second anti-surge circuit includes a second TFT, a gate electrode of which is connected to the output end of the operational amplifier, a source electrode of which is connected to the first input end of the OLED display panel, and a drain electrode of which is connected to the second input end of the OLED display panel.

In a possible embodiment of the present disclosure, the first TFT is a P-type TFT, and the second TFT is an N-type TFT.

In a possible embodiment of the present disclosure, the second time-delay circuit includes a third resistor, a fourth resistor and a second capacitor. One end of the third resistor is connected to a ground line, and the other end thereof is connected to a first end of the fourth resistor. The first end of the fourth resistor is further connected to the gate electrode of the first TFT, and a second end thereof is connected to the output end of the operational amplifier. The second capacitor is connected in parallel with the third resistor.

In a possible embodiment of the present disclosure, the OLED display assembly further includes a third capacitor arranged at the first input end of the OLED display panel. One end of the third capacitor is connected to the first input end of the OLED display panel, and the other end there of is connected to the ground line.

In a possible embodiment of the present disclosure, the OLED display assembly further includes a fourth capacitor arranged at the second input end of the OLED display panel. One end of the fourth capacitor is connected to the second input end of the OLED display panel, and the other end thereof is connected to the ground line.

In a possible embodiment of the present disclosure, the DC-DC power source driver chip is further provided with a voltage generator connected to the soft-start circuit, and configured to adjust a pulse width duty ratio and adjust a voltage applied to the OLED display panel into a normal step voltage.

In another aspect, the present disclosure further provides in some embodiments a display device including the above-mentioned OLED display assembly.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
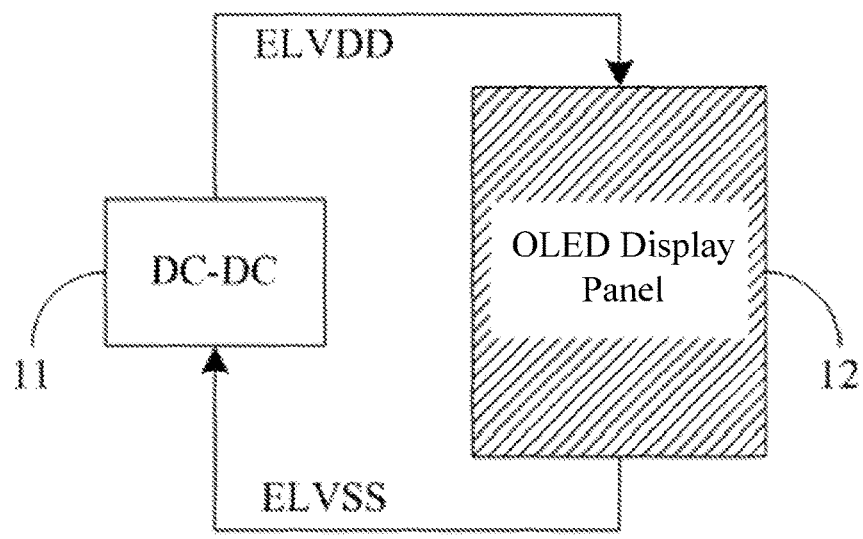
FIG. 1 is a schematic view showing an OLED display device.

As shown in FIG. 1, in the case that an AMOLED display device is started and a parasitic capacitor at a pixel region of an OLED display panel 12 is charged by a DC-DC power source driver chip 11, a large, instantaneous current surge may be generated by the DC-DC power source driver chip 11. In other words, in the case that a voltage is applied to a gate line Gate of the OLED display panel 12 earlier than to a high level signal end (ELVDD)/low level signal end (ELVSS), the ELVDD and ELVSS ends may be electrically connected to each other directly through an OLED at the moment of being started, and at this time, the current surge may occur in the circuit. In the case that the current surge, which has a value greater than a current-limiting threshold of the DC-DC power source driver chip 11, flows through the ELVSS end of the DC-DC power source driver chip 11, an over-current protection function of the DC-DC power source driver chip 11 may be triggered, and thereby the start of the AMOLED display device may fail.

In addition, a permissible voltage of an ELVSS pin of the DC-DC power source driver chip for supplying power to the AMOLED display device is usually 0.2V. At an initialization stage, i.e., after a voltage has been applied to the ELVDD end, a compensation end may be in an uncertain state, so the current leakage may occur for a pixel circuit of an OLED panel, and thereby a voltage having a value greater than 0.2V may probably applied to the ELVSS pin. Hence, in the case that the AMOLED display device is started, an impact may be applied to the ELVSS pin inside the DC-DC power source driver chip, and as a result, the DC-DC power source driver chip may probably be damaged.

The present disclosure provides in some embodiments an OLED display assembly and a display device, so as to suppress a current surge in the case that the display device is started, prevent the occurrence of display defects, prevent the occurrence of current leakage at an initialization stage, and improve the reliability of a DC-DC power source driver chip.

The OLED display assembly will be described hereinafter in more details in conjunction with the drawings and embodiments.

Figure 2:
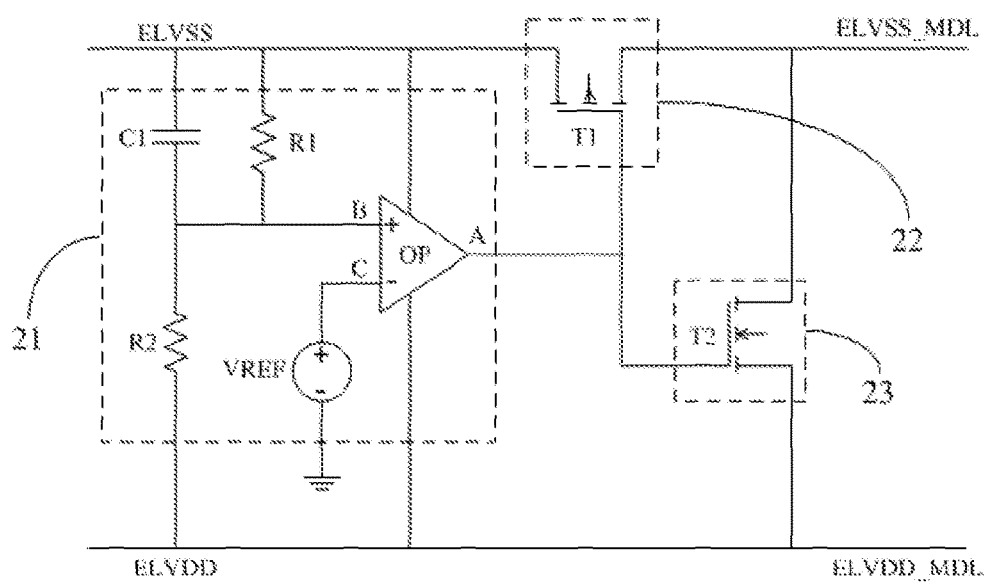
FIG. 2 is a circuit diagram of a soft-start circuit of an OLED display assembly according to one embodiment of the present disclosure.
Figure 5:
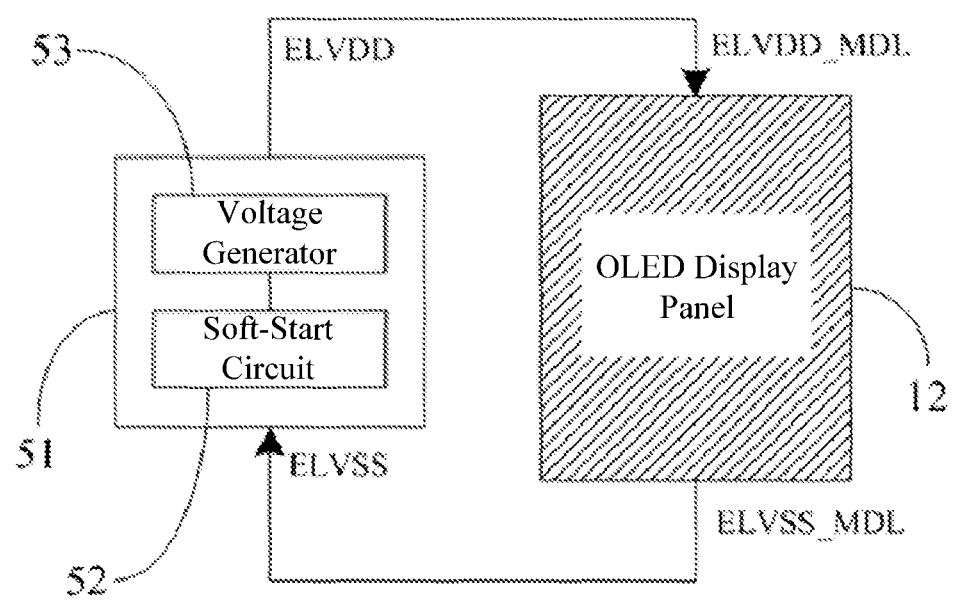
FIG. 5 is a schematic view showing the OLED display assembly according to one embodiment of the present disclosure.

As shown in FIGS. 2 and 5, the OLED display assembly includes a DC-DC power source driver chip 51 and an OLED display panel 12. The DC-DC power source driver chip 51 is provided with a soft-start circuit 52, which includes a first time-delay circuit 21, a first anti-surge circuit 22 and a second anti-surge circuit 23.

As shown in FIG. 2, a first input end of the first time-delay circuit 21 is connected to a high level signal line (corresponding to a high level signal ELVDD), a second input end thereof is connected to a low level signal line (corresponding to a low level signal ELVSS), and an output end thereof is connected to the first anti-surge circuit 22 and the second anti-surge circuit 23. The first time-delay circuit 21 is configured to disable the first anti-surge circuit 22 and enable the second anti-surge circuit 23 at an initialization stage, delay a voltage applied to the output end of the first time-delay circuit 21, and after the end of the initialization stage, enable the first anti-surge circuit 22 and disable the second anti-surge circuit 23.

The first anti-surge circuit 22 is connected between a first input end (corresponding to a low level signal ELVSS_MDL) of the OLED display panel and the second input end of the first time-delay circuit 21, and configured to control, after the end of the initialization stage, a voltage applied to the first input end of the OLED display panel.

The second anti-surge circuit 23 is connected between the first input end and a second input end (corresponding to a high level signal ELVDD_MDL) of the OLED display panel, and configured to control, at the initialization stage, a voltage applied to the first input end of the OLED display panel. The second input end of the OLED display panel is connected to the first input end of the first time-delay circuit 21.

To be specific, as shown in FIG. 2, the first time-delay circuit 21 includes a first resistor R1, a second resistor R2, a first capacitor C1 and an operational amplifier OP. One end of the first resistor R1 is connected to the second input end (corresponding to the low level signal ELVSS) of the first time-delay circuit 21, and the other end thereof is connected to one end of the second resistor R2. The other end of the second resistor R2 is connected to the first input end (corresponding to the high level signal ELVDD) of the first time-delay circuit 21. The first capacitor C1 is connected in parallel with the first resistor R1. A non-inverting input end B of the operational amplifier OP is connected between the first resistor R1 and the second resistor R2, an inverting input end C thereof is connected to a reference voltage end, and an output end A thereof is connected to the first anti-surge circuit 22 and the second anti-surge circuit 23.

In a possible embodiment of the present disclosure, the first anti-surge circuit 22 includes a first thin film transistor (TFT) T1, a gate electrode of which is connected to the output end A of the operational amplifier OP, a source electrode of which is connected to the second input end (corresponding to the low level signal ELVSS) of the first time-delay circuit 21, and a drain electrode of which is connected to the first input end (corresponding to the low level signal ELVSS_MDL) of the OLED display panel.

In a possible embodiment of the present disclosure, the second anti-surge circuit 23 includes a second TFT T2, a gate electrode of which is connected to the output end A of the operational amplifier OP, a source electrode of which is connected to the first input end (corresponding to the low level signal ELVSS_MDL) of the OLED display panel, and a drain electrode of which is connected to the second input end (corresponding to the high level signal ELVDD_MDL) of the OLED display panel.

In a possible embodiment of the present disclosure, the first TFT T1 is a P-type TFT, and the second TFT T2 is an N-type TFT.

An operation principle of the soft-start circuit will be described hereinafter in more details. Through the soft-start circuit, it is able to suppress a current surge in the case that the display device is started, prevent the occurrence of display defects, prevent the occurrence of the current leakage at the initialization stage, and improve the reliability of the DC-DC power source driver chip.

As shown in FIG. 2, in the case that the DC-DC power source driver chip starts to work, the high level signal ELVDD and the low level signal ELVSS may be generated. At this time, because the first input end of the first time-delay circuit 21 is connected to the high level signal line and the second input end thereof is connected to the low level signal line, the first time-delay circuit 21 starts to work. The inverting input end C of the operational amplifier OP is configured to receive a reference voltage VREF. At the initialization stage subsequent to the generation of ELVDD, an IR-drop on the second resistor R2 may be omitted, and at this time, a voltage VB applied to the non-inverting input end B of the operational amplifier OP is ELVDD. At this time, VB is greater than VREF, and a voltage VA applied to the output end A of the operational amplifier OP is ELVDD. The second TFT T2 is turned on and the first TFT T1 is turned off. For the voltage applied to the first input end of the OLED display panel, ELVSS_MDL=ELVDD_MDL-VDS, where VDS represents a source-to-drain voltage of the second TFT T2.

At the initialization stage, because the first TFT T1 is turned off, the first input end (corresponding to the low level signal ELVSS_MDL) of the OLED display panel may be electrically disconnected from the second input end (corresponding to the low level signal ELVSS) of the DC-DC power source driver chip. As a result, it is able to prevent the impact of the current leakage of the OLED display panel on the ELVSS pin of the DC-DC power source driver chip, thereby to protect the DC-DC power source driver chip and increase the reliability of the DC-DC power source driver chip.

In addition, the voltage applied to the first input end of the OLED display panel is ELVDD_MDL-VDS, i.e., ELVDD-VDS. Because VDS is of a relatively small value, the voltage applied to the first input end of the OLED display panel approaches to ELVDD at the initialization stage, and a voltage difference of an OLED in the OLED display panel is relatively small. As a result, it is able to suppress the occurrence of the current surge in the case that the display device is started and prevent the occurrence of the display defects.

With the elapse of time, the voltage applied to the non-inverting input end B of the operational amplifier OP may be dropped from ELVDD to VREF, and a time period for the voltage drop may be calculated using the following equation:

$$t1 = \tau \times \ln \frac{V}{V - VREF},$$

where $\tau$ represents a time-delay coefficient of the first time-delay circuit 21 and $\tau = R2 \times C1$, and V represents the high level signal EVLDD.

In the case that the voltage VB applied to the non-inverting input end B of the operational amplifier OP is VREF, a polarity of a voltage from the operational amplifier OP may be inverted. In the case that the first capacitor C1 is charged to a predetermined threshold, e.g., 0.99V, the first time-delay circuit may be in a stable state, and this process may take about $4\tau$ to $5\tau$. After the first time-delay circuit 21 is in the stable state, the voltage VB1 applied to the non-inverting end B of the operational amplifier OP may be calculated using the equation VB1=(ELVDD×R1+ELVSS×R2)/(R1+R2), and the voltage VB1 is smaller than VREF.

After the delay process made by the first time-delay circuit is ended, the voltage VB1 applied to the non-inverting end B of the operational amplifier OP may be smaller than VREF, and the voltage applied to the output end may be inverted. At this time, the voltage VA from the output end A of the operational amplifier OP is ELVSS, so the second TFT T2 is turned off and the first TFT T1 is turned on. Here, for an on-state voltage VON of the first TFT T1, VON=Vth<0. In the case that a voltage VGS applied to the gate electrode of the first TFT T1 is smaller than VON, the first TFT T1 is turned on. At this time, the low level signal ELVSS may be outputted by the DC-DC power source driver chip to the OLED display panel through the first TFT T1, and the OLED display panel may be turned on normally.

Figure 3:
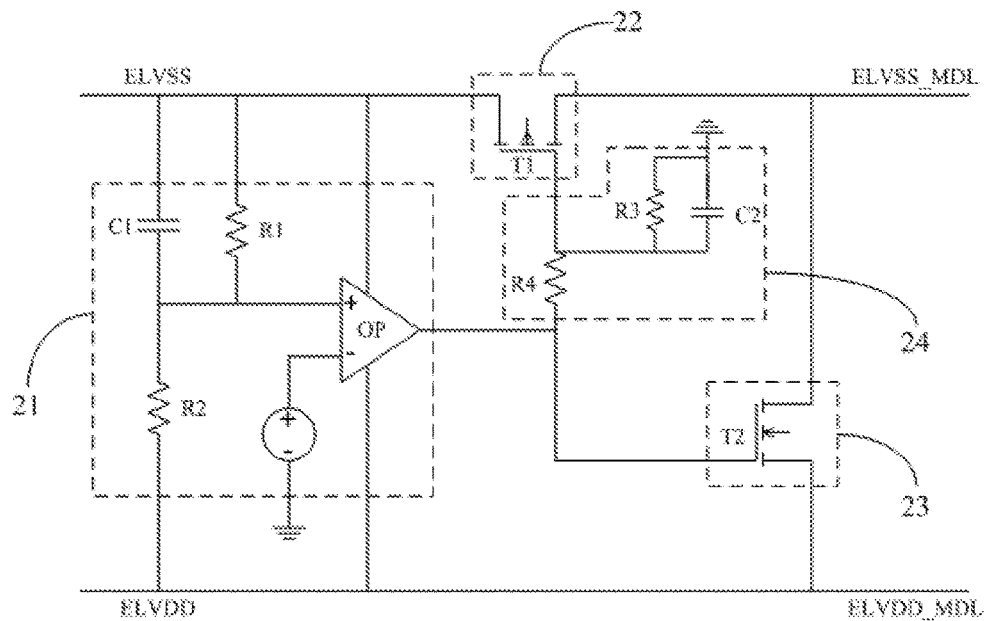
FIG. 3 is another circuit diagram of the soft-start circuit of the OLED display assembly according to one embodiment of the present disclosure.

In a possible embodiment of the present disclosure, as shown in FIG. 3, the soft-start circuit further includes a second time-delay circuit 24, one end of which is connected to the output end of the first time-delay circuit 21, the other end of which is connected to the first anti-surge circuit 22, and which is configured to control an operation of the first anti-surge circuit 22.

To be specific, the second time-delay circuit 24 includes a third resistor R3, a fourth resistor R4 and a second capacitor C2. One end of the third resistor R3 is connected to a ground line, and the other end thereof is connected to a first end of the fourth resistor R4. The first end of the fourth resistor R4 is further connected to the gate electrode of the first TFT T1, and a second end thereof is connected to the output end of the operational amplifier OP. The second capacitor C2 is connected in parallel with the third resistor R3.

An operation process of the first time-delay circuit 24 is similar to that of the first time-delay circuit 21, and a time-delay coefficient τ'=R4×C2. In the case that the second time-delay circuit 24 starts to work, the voltage applied to the gate electrode of the first TFT T1 is gradually changed from the voltage VA from the output end A of the operational amplifier OP, i.e., ELVSS, into VG (VG=R3/(R3+R4)× ELVSS). In the case that the on-state voltage of the first TFT T1 is VON, due to the second time-delay circuit 24, a time period taken by the voltage applied to the first TFT T1 to reach the on-state voltage may be calculated using the equation:

$$t2 = \tau' \times \ln\frac{V'}{V' - VON},$$

where τ' represents the time-delay coefficient of the second time-delay circuit 24 and τ'=R4×C2, and V' represents the low level signal ELVSS.

According to a curve of a current and a gate-to-source voltage for a P-type TFT, the current flowing through the first TFT T1 is limited to be very small at the beginning. Along with an increase in an absolute value of the gate-to-source voltage, the current allowed to flow through the first TFT T1 may increase gradually, i.e., in the embodiments of the present disclosure, the first TFT T1 is turned on in a delayed manner. At this time, the low level signal ELVSS applied from the DC-DC power source driver chip to the first input end (corresponding to the low level signal ELVSS_MDL) of the OLED display panel may increase gradually under the effect of the first TFT T1. As a result, in the case that the OLED display assembly is started, it is able to further suppress the current surge.

In the embodiments of the present disclosure, under the effect of the first time-delay circuit and the second time-delay circuit, it may take a time period t for the OLED display panel to be started, and t=t1+t2. After t, the first input end (corresponding to the low level signal ELVSS_MDL) of the OLED display panel starts to output a voltage to the OLED display panel. It may take about 5τ+t2 for the ELVSS_MDL to increase, and this time period may meet the requirement on the actual circuit design. The delay time may be achieved through two levels of resistor-capacitor (RC) time-delay circuit.

In the case that the OLED display assembly is powered off, no power may be applied to the DC-DC power source driver chip. At this time, the first resistor T1 and the first capacitor C1 of the first time-delay circuit may form a rapid discharging circuit, and the first TFT T1 and the second TFT T2 may be switched off rapidly so as to achieve the rapid discharge.

Figure 4:
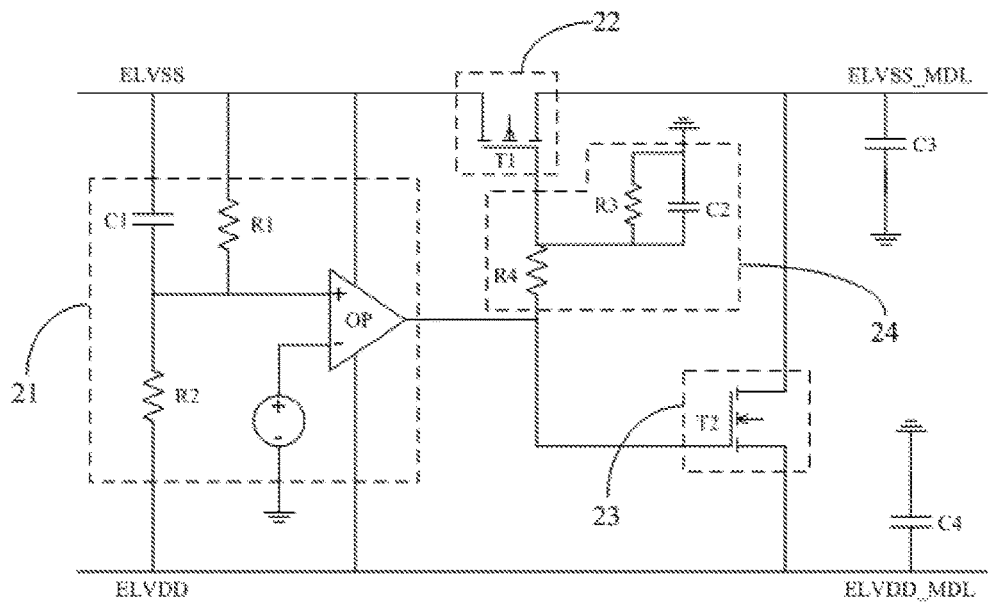
FIG. 4 is yet another circuit diagram of the soft-start circuit of the OLED display assembly according to one embodiment of the present disclosure.

In a possible embodiment of the present disclosure, as shown in FIG. 4, the OLED display assembly further includes a third capacitor C3 arranged at the first input end (corresponding to the low level signal ELVSS_MDL) of the OLED display panel. One end of the third capacitor C3 is connected to the first input end of the OLED display panel, and the other end there of is connected to the ground line.

In a possible embodiment of the present disclosure, the OLED display assembly further includes a fourth capacitor C4 arranged at the second input end (corresponding to the high level signal ELVDD_MDL) of the OLED display panel. One end of the fourth capacitor C4 is connected to the second input end of the OLED display panel, and the other end thereof is connected to the ground line.

Through the third capacitor C3 and the fourth capacitor C4, it is able to achieve voltage stabilization and filtration, thereby to stabilize the low level signal ELVSS_MDL and the high level signal ELVDD_MDL applied to the OLED display panel.

In a possible embodiment of the present disclosure, as shown in FIG. 5, the DC-DC power source driver chip 51 is further provided with a voltage generator 53 connected to the soft-start circuit 52, and configured to adjust a pulse width duty ratio and adjust a voltage applied to the OLED display panel 12 into a normal step voltage.

To be specific, a resistance RDS between the source electrode and the drain electrode of the first TFT T1 may be determined in accordance with an on state of the first TFT T1. For example, in the case of a current of 300 mA, the resistance RDS between the source electrode and the drain electrode of the first TFT T1 is about 200 mΩ to 300 mΩ, and at this time, an IR drop of about 0.06V to 0.1V may occur for the low level signal ELVSS from the DC-DC power source driver chip due to the first TFT T1. In order to compensate for this IR drop, the pulse width duty ratio may be adjusted by the voltage generator 53, until the appropriate voltage is applied to the OLED display panel.

The present disclosure further provides in some embodiments a display device including the above-mentioned OLED display assembly. The display device may be an OLED television or an electronic paper.

According to the embodiments of the present disclosure, the OLED display assembly includes the DC-DC power source driver chip and the OLED display panel. The DC-DC power source driver chip is provided with the soft-start circuit, which includes the first time-delay circuit, the first anti-surge circuit and the second anti-surge circuit. The first input end of the first time-delay circuit is connected to the high level signal line, the second input end thereof is connected to the low level signal line, and the output end thereof is connected to the first anti-surge circuit and the second anti-surge circuit. The first time-delay circuit is configured to disable the first anti-surge circuit and enable the second anti-surge circuit at the initialization stage, delay the voltage applied to the output end of the first time-delay circuit, and after the initialization stage is ended, enable the first anti-surge circuit and disable the second anti-surge circuit. The first anti-surge circuit is connected between the first input end of the OLED display panel and the second input end of the first time-delay circuit, and configured to control, after the end of the initialization stage, the voltage applied to the first input end of the OLED display panel. The second anti-surge circuit is connected between the first input end and the second input end of the OLED display panel, and configured to control, at the initialization stage, the voltage applied to the first input end of the OLED display panel. The second input end of the OLED display panel is connected to the first input end of the first time-delay circuit. Because the first anti-surge circuit is connected between the first input end of the OLED display panel and the second input end of the first time-delay circuit and the second anti-surge circuit is connected between the first input end and the second input end of the OLED display panel, the first time-delay circuit may disable the first anti-surge circuit and enable the second anti-surge circuit at the initialization stage. At the initialization stage, the first input end of the OLED display panel is electrically disconnected from the second input end of the first time-delay circuit through the first anti-surge circuit, so as to prevent an impact of current leakage of the OLED display panel on a pin of the DC-DC power source driver chip for applying a low level signal, thereby to protect the DC-DC power source driver chip and improve the reliability of the DC-DC power source driver chip. In addition, the first time-delay circuit is configured to delay the voltage applied to the output end of the first time-delay circuit, and after the end of the initialization stage, enable the first anti-surge circuit and disable the second anti-surge circuit. As a result, the first anti-surge circuit may operate in a delayed manner, so it is able to prevent the occurrence of the current surge in the case that a display device is started, thereby to prevent the occurrence of the display defects.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) display assembly, comprising: a direct current (DC)-DC power source driver chip and an OLED display panel, wherein
   the DC-DC power source driver chip is provided with a soft-start circuit, which comprises a first time-delay circuit, a first anti-surge circuit and a second anti-surge circuit;
   a first input end of the first time-delay circuit is connected to a high level signal line, a second input end of the first time-delay circuit is connected to a low level signal line, and an output end of the first time-delay circuit is connected to the first anti-surge circuit and the second anti-surge circuit;
   the first time-delay circuit is configured to disable the first anti-surge circuit and enable the second anti-surge circuit at an initialization stage, delay a voltage applied to the output end of the first time-delay circuit, and after the end of the initialization stage, enable the first anti-surge circuit and disable the second anti-surge circuit;
   the first anti-surge circuit is connected between a first input end of the OLED display panel and the second input end of the first time-delay circuit, and configured to control, after the end of the initialization stage, a voltage applied to the first input end of the OLED display panel;
   the second anti-surge circuit is connected between the first input end and a second input end of the OLED display panel, and configured to control, at the initialization stage, a voltage applied to the first input end of the OLED display panel; and
   the second input end of the OLED display panel is connected to the first input end of the first time-delay circuit.

2. The OLED display assembly according to claim 1, wherein the soft-start circuit further comprises a second time-delay circuit, one end of which is connected to the output end of the first time-delay circuit, the other end of which is connected to the first anti-surge circuit, and which is configured to control an operation of the first anti-surge circuit.

3. The OLED display assembly according to claim 1, wherein the first time-delay circuit comprises a first resistor, a second resistor, a first capacitor and an operational amplifier;
   one end of the first resistor is connected to the second input end of the first time-delay circuit, and the other end of the first resistor is connected to one end of the second resistor;
   the other end of the second resistor is connected to the first input end of the first time-delay circuit;
   the first capacitor is connected in parallel with the first resistor; and
   a non-inverting input end of the operational amplifier is connected between the first resistor and the second resistor, an inverting input end of the operational amplifier is connected to a reference voltage end, and an output end of the operational amplifier is connected to the first anti-surge circuit and the second anti-surge circuit.

4. The OLED display assembly according to claim 1, wherein the first anti-surge circuit comprises a first thin film transistor (TFT), a gate electrode of which is connected to an output end of an operational amplifier, a source electrode of which is connected to the second input end of the first time-delay circuit, and a drain electrode of which is connected to the first input end of the OLED display panel.

5. The OLED display assembly according to claim 1, wherein the second anti-surge circuit comprises a second TFT, a gate electrode of which is connected to an output end of an operational amplifier, a source electrode of which is connected to the first input end of the OLED display panel, and a drain electrode of which is connected to the second input end of the OLED display panel.

6. The OLED display assembly according to claim 4, wherein the first TFT is a P-type TFT.

7. The OLED display assembly according to claim 5, wherein the second TFT is an N-type TFT.

8. The OLED display assembly according to claim 2, wherein the second time-delay circuit comprises a third resistor, a fourth resistor and a second capacitor;
   one end of the third resistor is connected to a ground line, and the other end of the third resistor is connected to a first end of the fourth resistor;
   the first end of the fourth resistor is further connected to the gate electrode of the first TFT, and a second end of the fourth resistor is connected to an output end of an operational amplifier; and
   the second capacitor is connected in parallel with the third resistor.

9. The OLED display assembly according to claim 1, further comprising a third capacitor arranged at the first input end of the OLED display panel, wherein one end of the third capacitor is connected to the first input end of the OLED display panel, and the other end of the third capacitor is connected to the ground line.

10. The OLED display assembly according to claim 1, further comprising a fourth capacitor arranged at the second input end of the OLED display panel, wherein one end of the fourth capacitor is connected to the second input end of the OLED display panel, and the other end of the fourth capacitor is connected to the ground line.

11. The OLED display assembly according to claim 1, wherein the DC-DC power source driver chip is further provided with a voltage generator connected to the soft-start circuit, and configured to adjust a pulse width duty ratio and adjust a voltage applied to the OLED display panel into a normal step voltage.

12. A display device, comprising the OLED display assembly according to claim 1.

13. The display device according to claim 12, wherein the soft-start circuit further comprises a second time-delay circuit, one end of which is connected to the output end of the first time-delay circuit, the other end of which is connected to the first anti-surge circuit, and which is configured to control an operation of the first anti-surge circuit.

14. The display device according to claim 12, wherein the first time-delay circuit comprises a first resistor, a second resistor, a first capacitor and an operational amplifier;

one end of the first resistor is connected to the second input end of the first time-delay circuit, and the other end of the first resistor is connected to one end of the second resistor;

the other end of the second resistor is connected to the first input end of the first time-delay circuit;

the first capacitor is connected in parallel with the first resistor; and a non-inverting input end of the operational amplifier is connected between the first resistor and the second resistor, an inverting input end of the operational amplifier is connected to a reference voltage end, and an output end of the operational amplifier is connected to the first anti-surge circuit and the second anti-surge circuit.

15. The display device according to claim 12, wherein the first anti-surge circuit comprises a first thin film transistor (TFT), a gate electrode of which is connected to an output end of an operational amplifier, a source electrode of which is connected to the second input end of the first time-delay circuit, and a drain electrode of which is connected to the first input end of the OLED display panel.

16. The display device according to claim 12, wherein the second anti-surge circuit comprises a second TFT, a gate electrode of which is connected to an output end of an operational amplifier, a source electrode of which is connected to the first input end of the OLED display panel, and a drain electrode of which is connected to the second input end of the OLED display panel.

17. The display device according to claim 15, wherein the first TFT is a P-type TFT.

18. The display device according to claim 16, wherein the second TFT is an N-type TFT.

19. The display device according to claim 13, wherein the second time-delay circuit comprises a third resistor, a fourth resistor and a second capacitor;

one end of the third resistor is connected to a ground line, and the other end of the third resistor is connected to a first end of the fourth resistor;

the first end of the fourth resistor is further connected to the gate electrode of the first TFT, and a second end of the fourth resistor is connected to an output end of an operational amplifier; and the second capacitor is connected in parallel with the third resistor.

20. The display device according to claim 12, further comprising a third capacitor arranged at the first input end of the OLED display panel, wherein one end of the third capacitor is connected to the first input end of the OLED display panel, and the other end of the third capacitor is connected to the ground line.

* * * * *